United States Patent
Bandi et al.

(10) Patent No.: US 9,832,006 B1
(45) Date of Patent: Nov. 28, 2017

(54) METHOD, APPARATUS AND SYSTEM FOR DESKEWING PARALLEL INTERFACE LINKS

(71) Applicant: Intel Corporation, Santa Clara, CA (US)

(72) Inventors: Chenchu Punnarao Bandi, Pulaue Penang (MY); Amit Kumar Srivastava, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/162,884

(22) Filed: May 24, 2016

(51) Int. Cl.
*H04L 7/00* (2006.01)
*G06F 1/10* (2006.01)
*G11C 7/22* (2006.01)
*H04L 7/033* (2006.01)
*H03L 7/00* (2006.01)
*H04L 7/04* (2006.01)
*H03L 7/091* (2006.01)

(52) U.S. Cl.
CPC .............. *H04L 7/0016* (2013.01); *G06F 1/10* (2013.01); *G11C 7/222* (2013.01); *H04L 7/0008* (2013.01); *H04L 7/0037* (2013.01); *H04L 7/0087* (2013.01); *H04L 7/033* (2013.01); *H03L 7/00* (2013.01); *H03L 7/091* (2013.01); *H04L 7/005* (2013.01); *H04L 7/0079* (2013.01); *H04L 7/0091* (2013.01); *H04L 7/041* (2013.01)

(58) Field of Classification Search
CPC ..... H04L 7/0008; H04L 7/0087; H04L 7/033; H04L 7/0037; H04L 7/041; H04L 7/0016; H04L 7/005; H04L 7/0079; H04L 7/0091; H03L 7/00; H03L 7/091; G06F 1/10; G11C 7/222
See application file for complete search history.

(56) References Cited

U.S. PATENT DOCUMENTS 8,305,113 B1 * 11/2012 Payne ................... H03K 5/003
327/72
9,397,868 B1 * 7/2016 Hossain ............ H04L 25/03057
2002/0095628 A1 7/2002 Lee
(Continued)

OTHER PUBLICATIONS

International Searching Authority, "Notification of Transmittal of the International Search Report and the Written Opinion of the International Searching Authority," dated Sep. 20, 2017, in International application No. PCT/US2017/027862.

*Primary Examiner* — Michelle M Koeth
(74) *Attorney, Agent, or Firm* — Trop, Pruner & Hu, P.C.

(57) ABSTRACT

In one embodiment, an apparatus includes a clock channel to receive and distribute a clock signal to a plurality of data channels. At least some of the data channels may include: a first sampler to sample data; a second sampler to sample the data; and a deskew calibration circuit to receive first sampled data from the first sampler and second sampled data from the second sampler and generate a local calibration signal for use in the corresponding data channel. The apparatus may further include a global deskew calibration circuit to receive the clock signal from the clock channel, receive the first sampled data and the second sampled data from the plurality of data channels, and generate a global calibration signal for provision to the plurality of data channels. Other embodiments are described and claimed.

10 Claims, 10 Drawing Sheets

(56) References Cited

U.S. PATENT DOCUMENTS

| | | | |
|---|---|---|---|
| 2005/0066142 A1* | 3/2005 | Bhattacharya | G06F 13/4291 |
| | | | 711/169 |
| 2006/0006918 A1 | 1/2006 | Saint-Laurent | |
| 2007/0002845 A1 | 1/2007 | Kelly et al. | |
| 2010/0005212 A1* | 1/2010 | Gower | G06F 13/4234 |
| | | | 710/308 |
| 2010/0008460 A1 | 1/2010 | Liang-Zhang et al. | |
| 2013/0249612 A1* | 9/2013 | Zerbe | H04L 7/0079 |
| | | | 327/161 |
| 2013/0346695 A1* | 12/2013 | Loh | G06F 12/0895 |
| | | | 711/122 |
| 2014/0114887 A1* | 4/2014 | Iyer | G06N 99/005 |
| | | | 706/12 |
| 2014/0140439 A1* | 5/2014 | Agrawal | G06F 1/10 |
| | | | 375/316 |
| 2015/0304098 A1 | 10/2015 | Garg et al. | |
| 2016/0077905 A1 | 3/2016 | Menon et al. | |
| 2016/0091941 A1 | 3/2016 | Kumar et al. | |

\* cited by examiner

610

At start, if CK samples the data as HIGH

Case 1
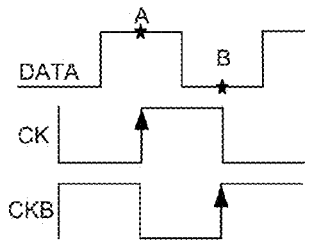
AB=10: push the Feed Back Clock
No Correction

620

At start, if CK samples the data as LOW

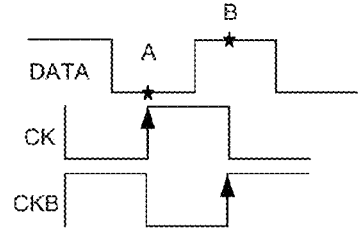
AB=01: push the Feed Back Clock
No Correction

Case 2
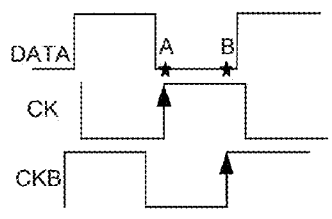
AB=00: Negative Skew
Perform Correction

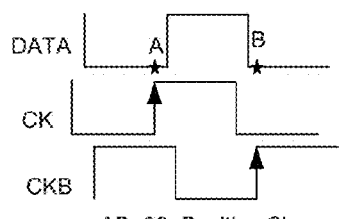
AB=00: Positive Skew
Perform Correction

Case 3
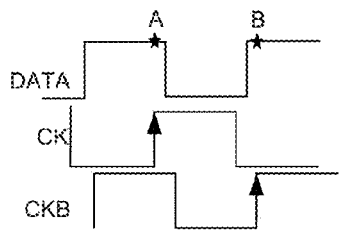
AB=11: Positive Skew
Perform Correction

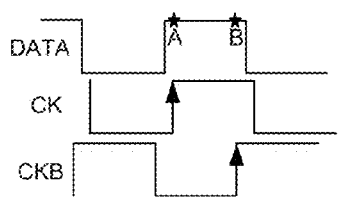
AB=11: Negative Skew
Perform Correction

Case 4
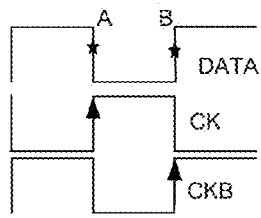
AB=dithering
STOP

Case 4
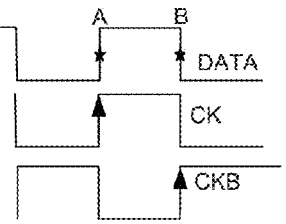
AB=dithering
STOP

FIG. 6

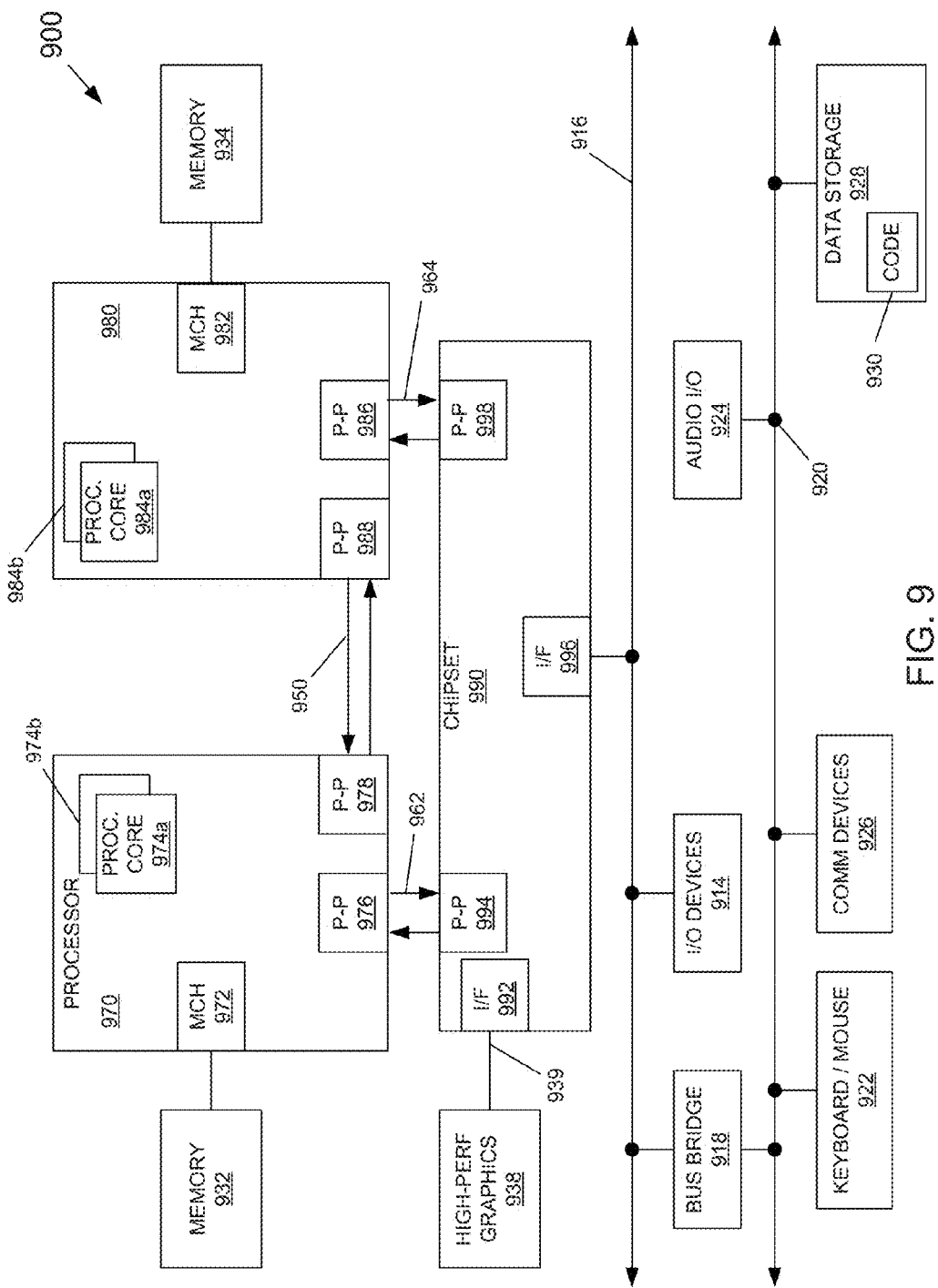

METHOD, APPARATUS AND SYSTEM FOR DESKEWING PARALLEL INTERFACE LINKS

TECHNICAL FIELD

Embodiments relate to clock generation and control in a receiver.

BACKGROUND

Source synchronous multi-lane parallel interface communication links can suffer from timing margin issues due to skew between respective lanes of the link. One of the main sources of skew is due to distributing a received clock to corresponding parallel receiver data channels. Such skew increases as the number of data channels increases. Similarly, skew contribution will be more significant as communication speeds increase. High levels of skew in a receiver can cause the receiver to exceed a skew budget and further to decrease system AC margin timing, both of which can adversely affect performance.

BRIEF DESCRIPTION OF THE DRAWINGS

FIG. 6 is a graphical illustration of example data sampling cases in accordance with an embodiment.

FIG. 9 is a block diagram of a system in accordance with an embodiment of the present invention.

DETAILED DESCRIPTION

Figure 1:
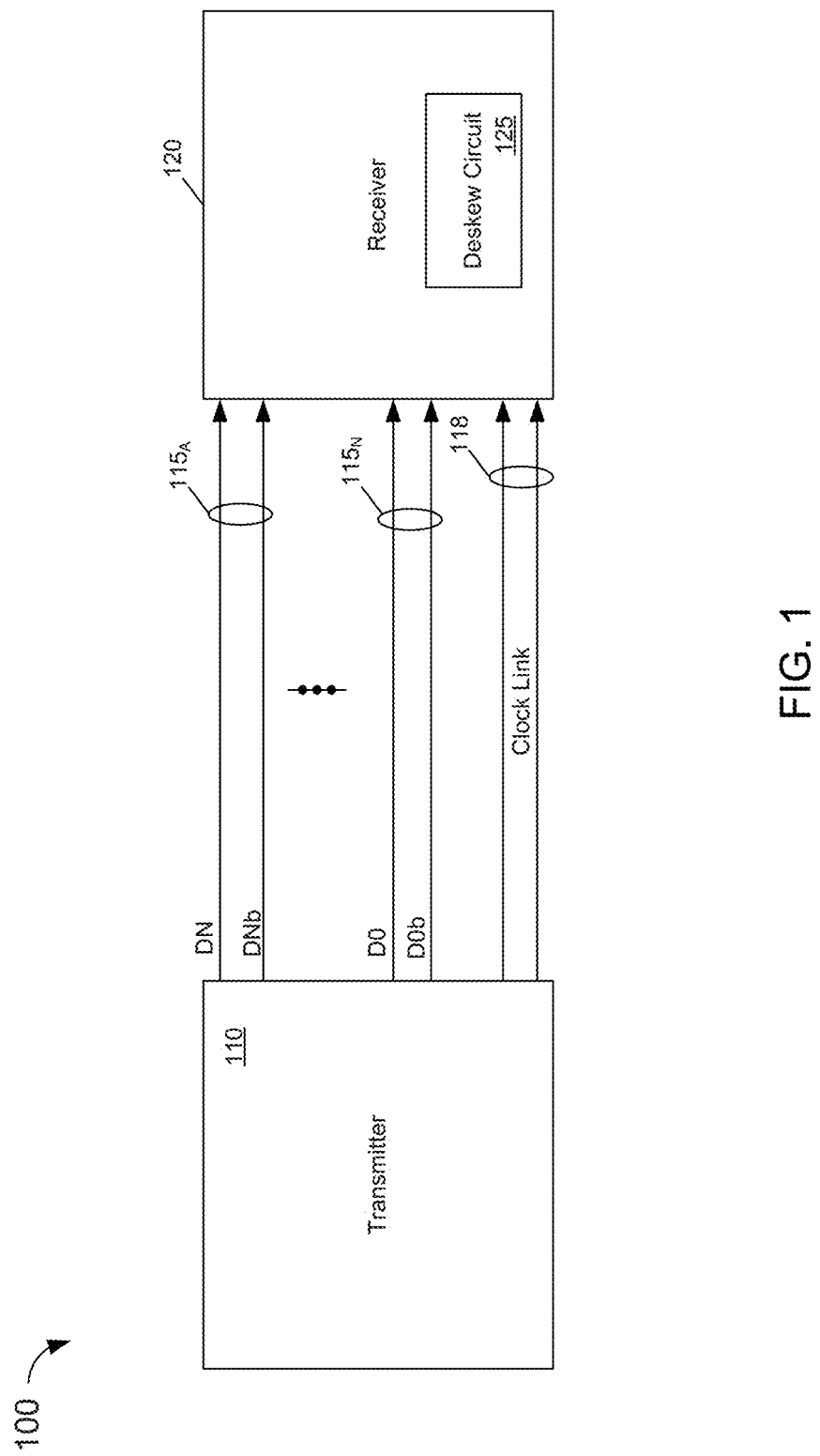
FIG. 1 is a block diagram of a system in accordance with an embodiment of the present invention.

In various embodiments, a receiver is provided with a deskew circuit to reduce or remove skew occurring across a plurality of data channels in a source synchronous communication system. In particular embodiments described herein, this deskew circuit can be implemented in a distributed manner, with some circuitry internal to given data channels (and therefore local to a given channel) and some circuitry external to the individual data channels (and therefore global). In addition, embodiments enable deskew circuitry to be calibrated dynamically during normal operation. Such calibration can be performed automatically and dynamically, in a manner transparent to a user. To this end, a deskew calibration circuit as described herein can use an internal controller, such as a microcontroller, finite state machine or other control circuit to initiate and control a calibration routine. Such calibration routine may include update to correction codes used both for local deskew circuits as well as correction codes generated by global circuitry for use in global deskew control. As such, embodiments may perform deskew calibration and correction operations using hardware, software, firmware and/or combinations thereof.

At a high level, a calibration process performed by the deskew circuitry may be based on receipt and processing of incoming information having predetermined characteristics. For example, in various embodiments a predetermined data sequence can be received and processed to identify an amount of skew occurring locally (between local clocks within a given local data channel) as well an amount of skew occurring between the different data channels.

To this end, in one embodiment a calibration process may be performed by first receiving and processing a predetermined data sequence of a training sequence via the various data channels to record the sample outcomes of the training sequence from all lanes. Thereafter, a lane-to-lane deskew process may be performed to compensate lane-to-lane deskew. In an embodiment, this lane-to-lane deskew process may be performed by: scanning an entire unit interval (UI) by delaying a global clock signal with one edge and finding a data edge transition; measuring skew of each lane from an averaged clock phase; and applying a correction code oppositely to compensate the skew of the lane using a global delay adjuster located in each lane. Also, an intra-pair skew compensation process may be performed. This intra-pair skew compensation may be performed locally in each data channel. In an embodiment, this intra-pair skew compensation process may be performed by: scanning the entire UI from a locked position using 0 and 180 degree clock phases; measuring UI edge transitions and skew; and applying a correction code to compensate intra-pair skew using a local delay adjuster of each lane. As will be described herein, note that the lane-to-lane skew process and the intra-pair skew process may be performed in an iterative fashion until at least a threshold amount of skew has been removed, both from the internal data channel point of view as well as the lane-to-lane point of view. As such, in some cases these separate but interdependent processes may be performed repeatedly until an indication that minimal or no skew is detected.

By providing an automatic detection and correction process within a receiver, validation costs during manufacture of the receiver can be reduced such as post-silicon high volume manufacturing (HVM) validation effort, without any software tuning. Still further, embodiments enable obtaining additional skew margin as the dynamic and automatic tuning described herein can enable operation with lower levels of skew. Timing margin realized via embodiments helps in improving link AC timing margin. Embodiments can be used for a wide variety of serial connection links such as Mobile Industry Processor Interface (MIPI)-Data Physical Unit (DPhy), MIPI-Camera Serial Interface (CSI2), double data rate (DDR) and on-chip package high speed parallel interface, where the number of lanes increases predominantly.

Referring now to FIG. 1, shown is a block diagram of a high level view of a portion of a system in accordance with an embodiment of the present invention. As shown in FIG. 1, system 100 includes a transmitter 110 coupled to a receiver 120. As examples, transmitter 110 and receiver 120 may be different functional units on a single semiconductor die (such as of a given system on chip). Alternately, transmitter 110 and receiver 120 may be different semiconductor die of a multichip module (MCM). In still further examples, transmitter 110 and receiver 120 may be different integrated circuits coupled together via parallel links of a circuit board.

As further illustrated in FIG. 1, transmitter 110 may couple to receiver 120 via a set of multi-lane parallel interface links $115_A$-$115_N$. Each link 115 is coupled to a given data lane or channel of receiver 120 (details not shown in FIG. 1). In the embodiment of FIG. 1, each link 115 may be implemented as a single-ended or differential signal pair of traces or other conductive elements to communicate information, e.g., serially. In addition, a clock link 118 is provided to communicate a source synchronous clock from transmitter 110 to receiver 120. Clock link 118 may be a one-wire or two-wire interconnect, in different embodiments.

Due to the arrangement, there may be a skew in the received clock signal. This received clock signal is distributed to the individual lanes and locally converted into multiple phases to enable data sampling operations to occur. To this end, in various embodiments receiver 120 may include a deskew circuit 125 as described herein, to enable automatic, efficient and dynamic update to correction codes used in delay circuitry of individual lanes to reduce or remove skew. As will be described herein, deskew circuit 125 may perform global and local deskew calibration operations.

Figure 2A:
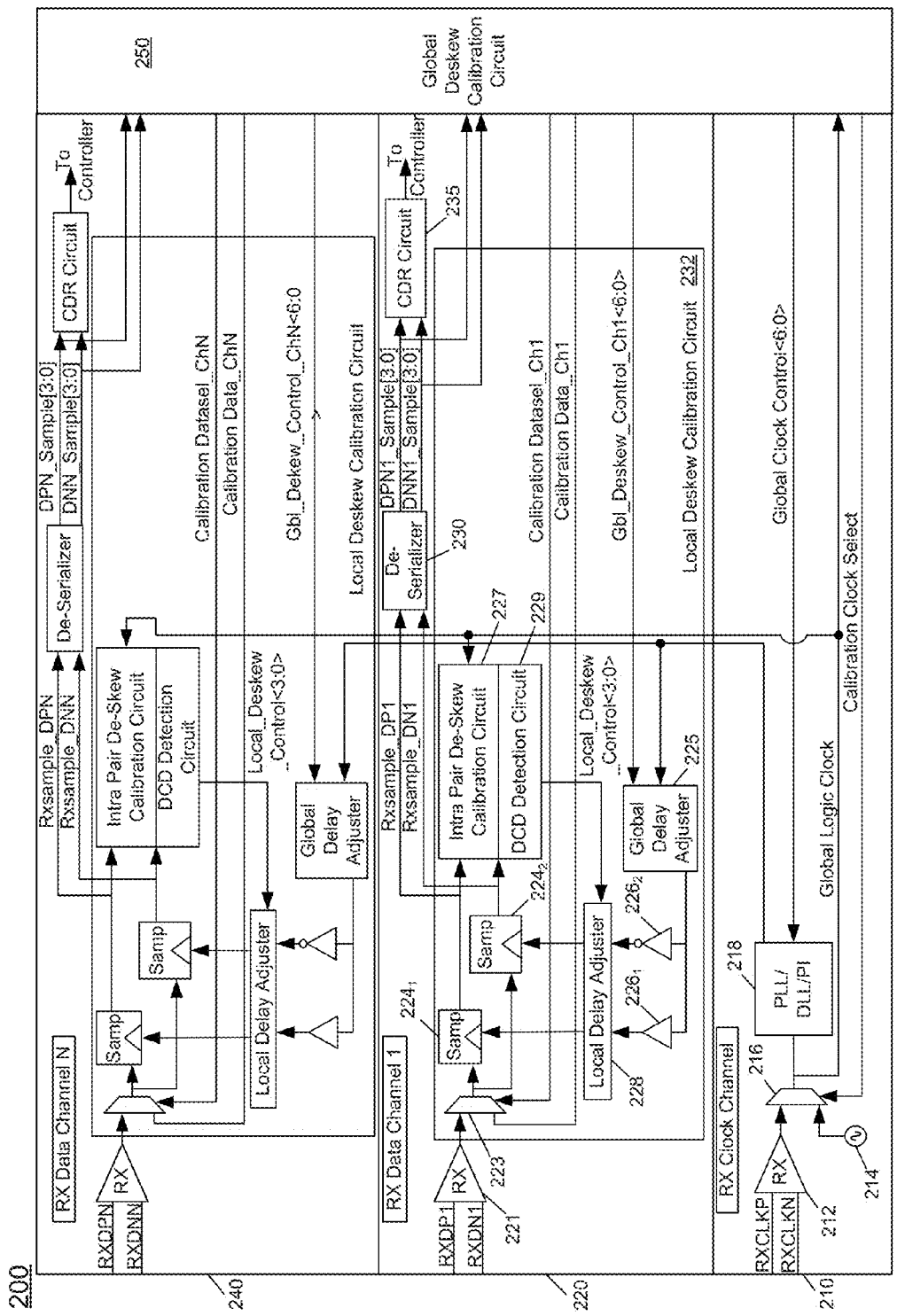
FIG. 2A is a block diagram of a portion of a receiver in accordance with an embodiment of the present invention.

Referring now to FIG. 2A, shown is a block diagram of a portion of a receiver in accordance with an embodiment of the present invention. The portion of receiver 200 shown in FIG. 2A may be a front end or interface circuit that is configured to receive incoming clock and signal information such as in a source-synchronous arrangement. As illustrated, receiver 200 includes a plurality of data channels (two data channels 220 and 240 are illustrated). Understand of course that many other data channels may be present in different examples. In addition, a receiver clock channel 210 is provided. Receiver 200 may include deskew circuitry, which in different embodiments can be implemented as hardware circuitry, software, and/or firmware, or combinations thereof, to perform deskewing of clock signals as described herein. More specifically, embodiments provide an auto-tuning or calibration technique that can be used to dynamically and automatically update correction codes for different channels of the receiver.

As illustrated in FIG. 2A, receiver clock channel 210 includes a receiver 212. In the embodiment shown, receiver 212 may be a differential amplifier configured to receive incoming differential clock signals (RXCLKP and RXCLKN). In turn, receiver 212 outputs a single clock signal to a selector circuit 216, which in an embodiment may be implemented as a multiplexer. As illustrated, selector circuit 216 further receives a calibration clock signal from a clock circuit 214, which in an embodiment may be implemented as local oscillator. Depending upon control, a selected one of these clock signals can be output from selector circuit 216 to a clock generation circuit 218. As illustrated, selector circuit 216 may be controlled responsive to receipt of a calibration clock select signal. In an embodiment, this select signal may be issued to cause the calibration clock signal output by clock circuit 214 to be used, e.g., during a calibration routine. In an embodiment, clock generation circuit 218 may be implemented as a phase lock loop (PLL)/delay lock loop (DLL)/phase interpolator (PI). In addition, clock generation circuit 218 further receives a global clock control signal (GlobalClockControl <6:0>), which is used to globally shift the clock position to all the lanes. Accordingly, clock generation circuit 218 outputs a clock signal (referred to herein as CK) to each of receiver data channels 220/240.

In embodiments, each of multiple data channels can be formed of substantially the same circuitry. Accordingly, for ease of discussion, details regarding receiver data channel 220 are discussed. However, understand that such discussion is applicable to other receiver data channels including receiver data channel 240. As illustrated, incoming receiver data (RXDP1/RXDN1) is received in a receiver 221, which may be implemented as a differential amplifier to output a single-ended signal. As illustrated, this signal is provided through a selection circuit 223 to a pair of data samplers $224_1$-$224_2$. In a particular embodiment data samplers 224 may be implemented as D-type flip flops. These samplers may be clocked on rising edges of a sampling clock signal received from a local delay adjuster 228. More specifically, as shown in FIG. 2, local delay adjuster 228 outputs a first sampling clock signal to data sampler $224_1$, which is used to clock data sampler $224_1$ to sample the received data. In turn, local delay adjuster 228 also outputs a second sampling clock signal to data sampler $224_2$, which is used to clock data sampler $224_2$ to sample the received data. In an embodiment, local delay adjuster 228 may be implemented as a delay circuit (e.g., including a plurality of individual delay elements, such as D-type flip flops or other delay circuitry). As such, each data sampler $224_1$-$224_2$ outputs sampled data at a different clock phase. In embodiments, these data samplers may be controlled to output samples out of phase by 180°, namely at 0° and 180° phases. However, due to skew, variations can occur and may be controlled using the techniques described herein.

As illustrated, the clock signal output by receiver clock channel 210 is provided to a global delay adjuster 225, which may apply a global delay indicated by a global deskew control signal (Gbl_Deskew_control_Ch1 <6:0>). In an embodiment, global delay adjuster 225 may be implemented as a delay circuit (e.g., including a plurality of individual delay elements, such as D-type flip flops or other delay circuitry). The corresponding (potentially) delayed clock signal output by global delay adjuster 225 is provided to a pair of buffers $226_1$ and $226_2$. Buffer $226_2$ may be implemented as an inverter to output a clock signal that is 180 degrees out of phase with the zero degree phase clock signal output by buffer $226_1$. These clock signals are provided to local delay adjuster 228, where a local deskew adjustment may be performed responsive to a local deskew control signal (Local_deskew_Cntrl <3:0>) received from a duty cycle detection (DCD) circuit 229, which in turn is coupled to an intra-pair deskew calibration circuit 227. As such, local delay adjuster 228 outputs first and second sampling clock signals to samplers $224_1$ and $224_2$, respectively, which are 180 degrees out of phase with each other. As seen, deskew calibration circuit 227 is configured to receive the received samples from samplers $224_1$/$224_2$, along with the Global Logic Clock, which can be used to perform the deskew calibration described herein.

As further illustrated in FIG. 2A, the receiver sampled signals from samplers $224_1$/$224_2$ further may be sent to a de-serializer 230 to obtain parallel differential data samples. These signals can be sent to a global deskew calibration circuit 250, and further to a clock and data recovery (CDR) circuit 235, and further sent to one or more consuming circuitry within receiver 200. Similar circuitry is present in data channel 240.

In various embodiments, global deskew calibration circuit 250 may include a controller to enable a global calibration and instruct local calibrations to be performed within the individual data channels 220. Understand while shown at this high level in the embodiment of FIG. 2A, many variations and alternatives are possible.

In one embodiment, a skew compensation process as described herein may begin when clock generation circuit 218 has completed strobe/clock centering. At this point, a given training pattern can be communicated by the transmitter. In other cases, global deskew calibration circuit 250 may cause generation of this training pattern internally to a receiver as provided through multiplexer 223 (and similarly for a calibration clock as provided by multiplexer 216). In one embodiment, the predetermined data sequence may be a repeating signature pattern of 101010 values, but other patterns are possible such as other stress patterns. Note that this communication of the predetermined data sequence may occur at a supported link frequency or slower on all the data channels at a time or alternate lanes, to mitigate any cross skew. Note that in embodiments, the received clock/strobe is distributed in a balanced way to all lanes. In turn, as shown above in FIG. 2A, each data channel 220/240 locally generates multiple clock phases from this received clock signal (CK and CKB phases).

Locally, samplers within each lane sample the data using the multiple clock signals (CK and CKB (0, 180 degree phase)). The sampled data in turn is provided to global deskew calibration circuit 250. In an embodiment, such circuit may include a digital filter to filter this incoming data. In addition, circuit 250 may include various storages to store the received sample data for each of the data channels.

Different control paths of operation may occur depending upon the state of the received data. Two use cases are described (each having multiple control pathways), namely depending on whether the first sample data is a logic one or zero.

When the first sample data is a logic high value: (1) if RX Sample AB=10, this indicates that no intra-pair skew correction is needed; (2) if Rx Sample AB=11, this indicates presence of a positive skew (CK to CKB delay is greater than an UI). As such, at this point the corresponding intra-pair deskew calibration circuit 227 of the corresponding data channel may be triggered to perform intra pair deskew to correct this positive skew via a local delay adjuster; (3) if RX Sample AB=00, this indicates presence of a negative skew (CK to CKB delay is less than an UI). As such, at this point the corresponding intra-pair deskew calibration circuit 227 of the corresponding data channel may be triggered to perform intra pair deskew to correct this negative skew via a local delay adjuster; (4) note that both of the above (2 and 3) polarity correction procedures (positive or negative skew) depends on a determined duty cycle between the phases of the clock signals of the data channel.

Instead when the first sample data is a logic low value: (1) if RX Sample AB=01, this indicates that no intra-pair skew correction is needed; (2) if Rx Sample AB=11, this indicates presence of a negative skew (CK to CKB delay is less than an UI). As such, at this point the corresponding intra-pair deskew calibration circuit 227 of the corresponding data channel may be triggered to perform intra pair deskew to correct this negative skew via a local delay adjuster; (3) if RX Sample AB=00, this indicates presence of a positive skew (CK to CKB delay is greater than an UI). As such, at this point the corresponding intra-pair deskew calibration circuit 227 of the corresponding data channel may be triggered to perform intra pair deskew to correct this positive skew via a local delay adjuster; (4) note that both of the above (2 and 3) polarity correction procedures (positive or negative skew) depends on a determined duty cycle between the phases of the clock signals of the data channel.

From PI/DLL delay codes and samples from each lane, a difference between delays from a mean phase can be measured and recorded in, e.g., a decision matrix shift register. Thereafter, a best phase can be determined. In an embodiment, this phase determination can be performed using a given averaging algorithm. The resulting correction code for each data channel can be sent to the corresponding channel to compensate for the skew of each lane via the corresponding global delay adjuster of the channel.

Figure 2B:
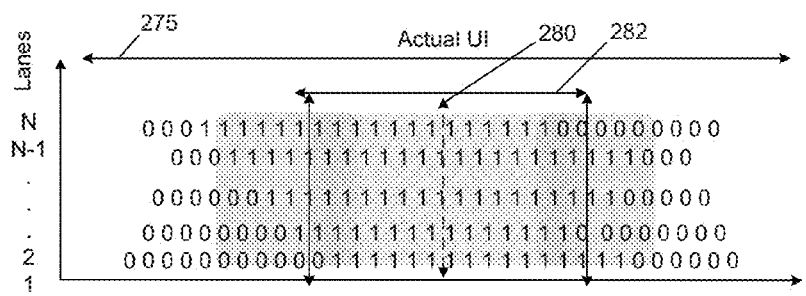
FIGS. 2B-2D are illustrations of skew correction based on sampled data for each of a plurality of lanes in accordance with an embodiment of the present invention.
Figure 2C:
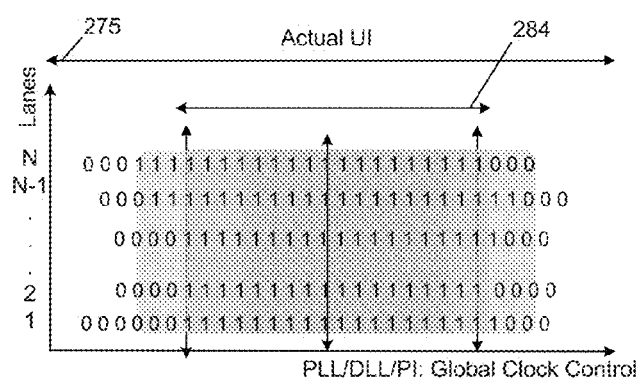
Figure 2D:
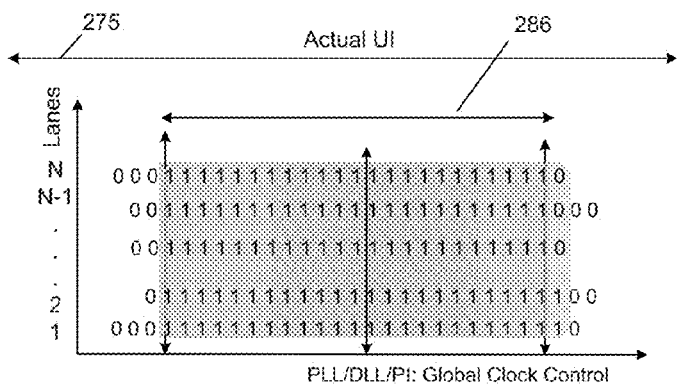

Referring now to FIGS. 2B-2D, shown are illustrations of skew correction based on sampled data for each of a plurality of lanes 1-N as stored in a shift register, e.g., present in a global deskew calibration circuit. As seen, each lane or channel samples the same data at different phases depending on various conditions. FIG. 2B shows storage of data with an original eye opening for a corresponding unit interval in which the global clock is positioned to sample the data within this eye opening. More specifically in FIG. 2B, UI 275 corresponds to a unit interval for the global logic clock. Within this UI 275, an eye opening 282 is provided in which data may be sampled according to a global clock signal 280. As illustrated in FIGS. 2B-2D, different eye openings 282, 284 and 286 can be realized, with the wider data eye openings 284 and 286 resulting from deskew correction techniques in accordance with various embodiments.

Using a correction method as described herein, this eye opening can be increased, as shown in FIG. 2C. More specifically, FIG. 2C shows an embodiment with an improved eye margin on both the left and right sides of the eye opening. This deskew correction method may be based on an averaging method of skew adjustment on both sides. In such embodiment, an average global control code of a first failure/transition of any one lane to a last failure/transition of any lane is selected as the margin boundary for the corresponding left and right sides, respectively.

Referring now to FIG. 2D, shown is an even wider eye opening for data sampling. This wider eye opening can be realized using a min-max method of skew adjustment on both left and right sides. In such embodiment, for the right side, a control code can be selected corresponding to the lane having the maximum global control code for failure/transition. In turn on the left side, a minimum global control code can be established for the corresponding lane having the minimum global control code for failure/transition. Using such method, a greater eye margin is realized than the averaging method described above with regard to FIG. 2C. Understand that in yet other embodiments, other types of correction code generation can occur.

Figure 3:
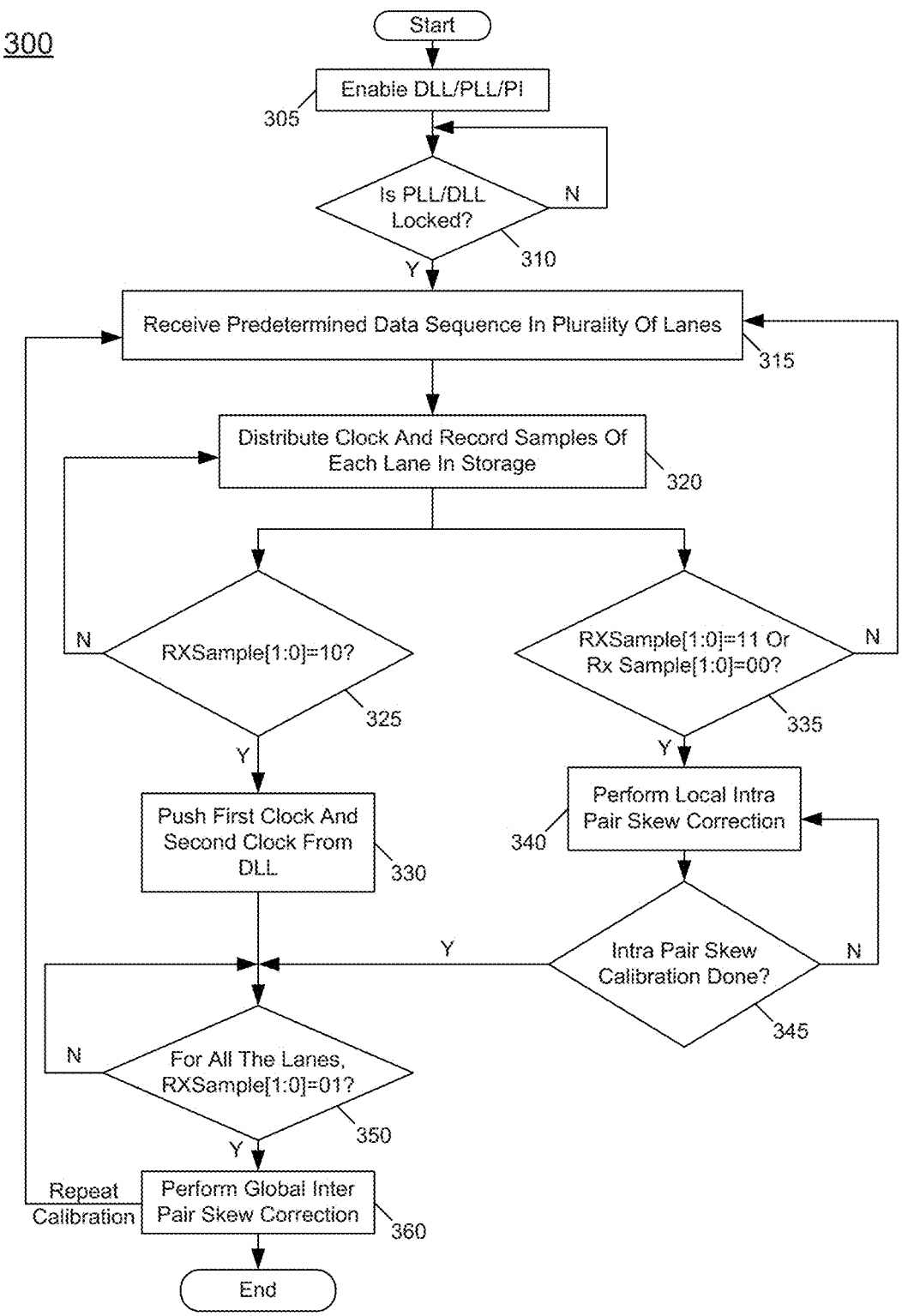
FIG. 3 is a flow diagram of a method in accordance with an embodiment of the present invention.

Referring now to FIG. 3, shown is a flow diagram of a method in accordance with an embodiment of the present invention. More specifically, method 300 shown in FIG. 3 may be performed by hardware circuitry, software, and/or firmware, or combinations thereof. Method 300, which is a global deskew method, may be performed by deskew circuitry within a receiver. As illustrated, method 300 begins by enabling a DLL/PLL/PI (block 305). Next is it determined whether the PLL/DLL is locked (diamond 310). If so, control passes to block 315, where a predetermined data sequence may be received during this calibration process. In an embodiment, the predetermined sequence may be an alternating string of logic ones and logic zeros, to provide an ability to identify phase variances. Next at block 320 a global clock may be distributed and samples of each lane can be recorded in a storage (which in an embodiment may be a non-transitory storage medium of a global deskew calibration circuit). From received sample data, it is determined whether it is of particular values. More specifically, it is determined at diamond 325 if RXSample [1:0] is equal to a value of "10." If not, control passes back to block 320. If so, there is no intra-pair skew, and no local skew correction is needed. Accordingly, control passes to block 330 where a first clock and a second clock may be pushed from the DLL. Otherwise, if it is determined at diamond 335 that RXSample [1:0] is either a value of "11" or "00," control passes to block 340 where a local intra-pair skew correction process may be performed. In an embodiment, a finite state machine (FSM) may be configured to perform this local intra-pair skew correction. After such execution it is determined whether this intra-pair skew calibration is completed (diamond 345).

Still referring to FIG. 3, control next passes (from both of diamonds 330 and 345) to diamond 350, where it is determined whether for all lanes the sampled data RXSample [1:0] has a value of "01." If so, control passes to block 360 where a global inter-pair skew correction method may be performed. In an embodiment, a global inter-pair skew correction FSM may be provided to perform such correction. This process may be performed multiple times until a desired amount of correction is realized, at which point calibration for all lanes is completed.

Figure 4:
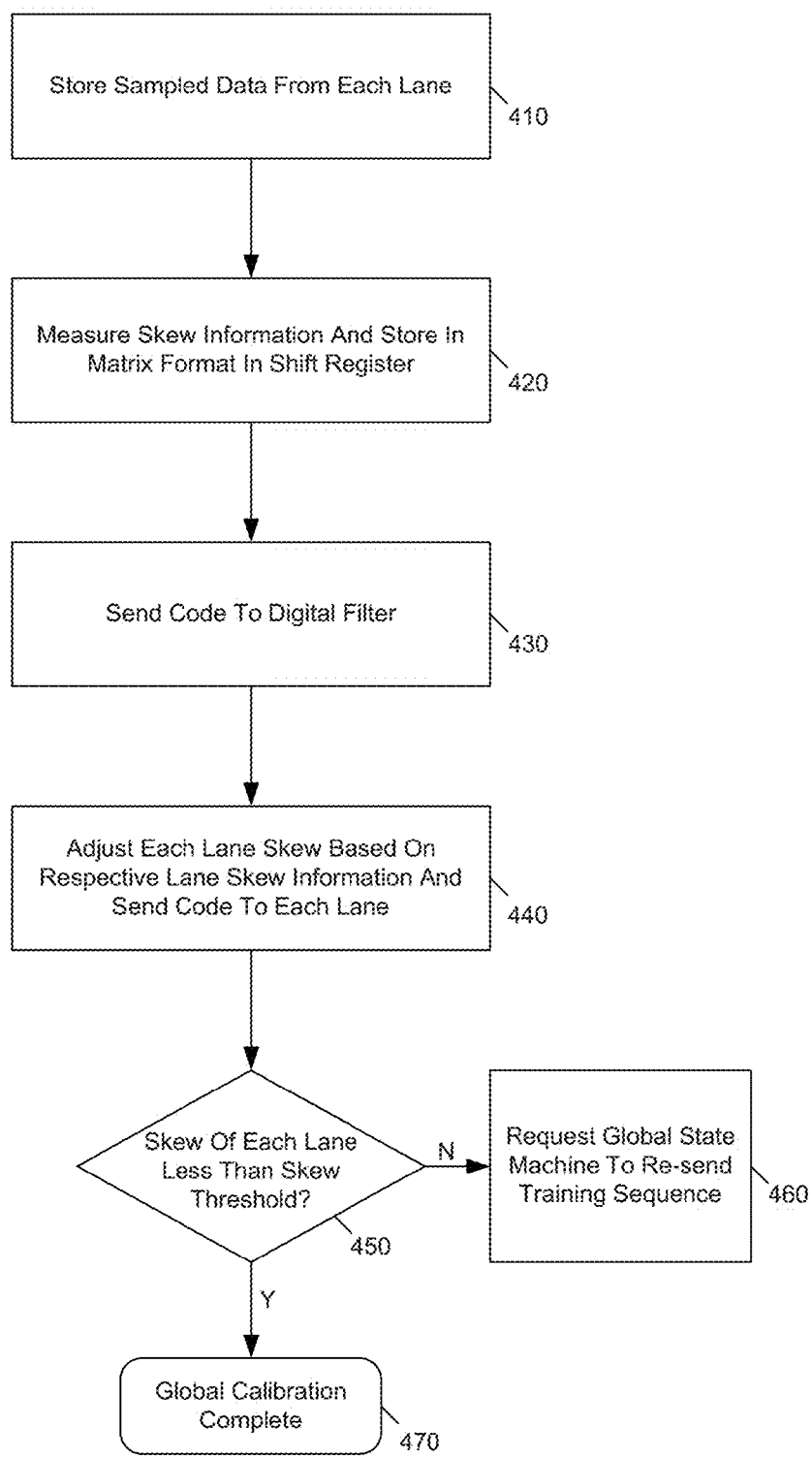
FIG. 4 is a flow diagram of a method for performing global skew correction in accordance with an embodiment.

Referring now to FIG. 4, shown is a flow diagram of a method for performing global skew correction method in accordance with an embodiment. More specifically, method 400 shown in FIG. 4 may be performed by hardware circuitry, software, and/or firmware, or combinations thereof. Method 400 may be performed by a global deskew correction circuit, in an embodiment.

As shown in FIG. 4, method 400 begins by storing the sampled data from each lane (block 410). In an embodiment, this sampled data may be the 0° phase data. Next at block 420 skew information is measured. More specifically, this skew information may be for each lane with respect to the known best phase from the PLL/DLL. This measured skew information may be stored in matrix format in a shift register, in an embodiment. Thereafter, control passes to block 430 where a code (namely the stored skew information) can be sent to a digital filter as a correction code. Next, at block 440 each lane skew can be adjusted based on the respective lane skew information. Still further, the code can be sent to each lane, and more specifically to its global skew adjuster to deskew the incoming received clock in corresponding channel.

Still referring to FIG. 4, next it is determined whether the skew of each lane is less than a skew threshold (Tskew) (diamond 450). If not, control passes to block 460 where an indication can be sent to a global state machine to resend the calibration or training sequence. Otherwise, control passes to block 470 where global calibration is complete.

Figure 5:
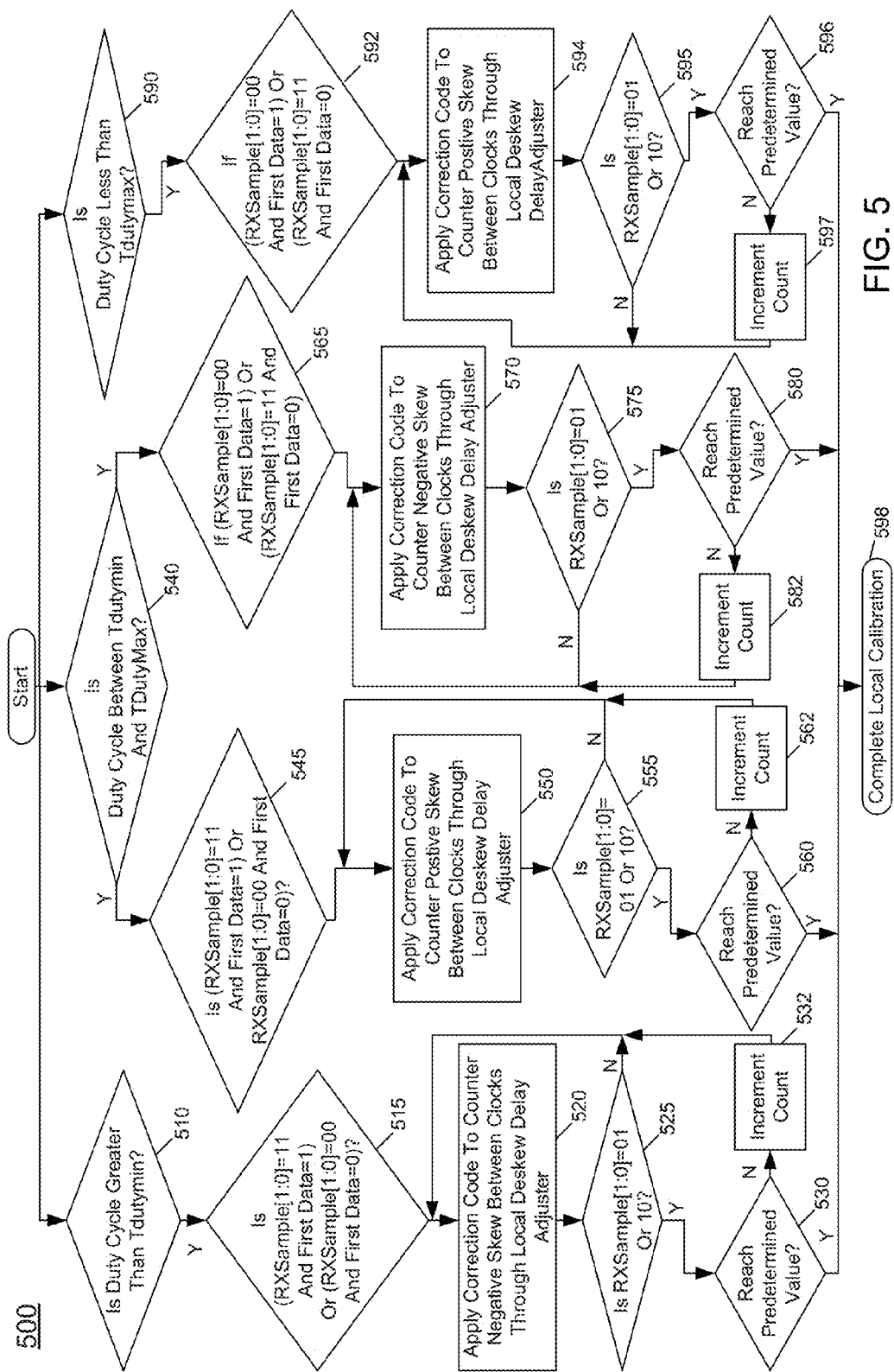
FIG. 5 is a flow diagram of a method for performing intra-pair lane deskew correction in accordance with an embodiment of the present invention.

Referring now to FIG. 5, shown is a flow diagram of a method for performing intra-pair lane deskew correction in accordance with an embodiment of the present invention. More specifically, method 500 shown in FIG. 5 may be performed by hardware circuitry, software, and/or firmware, or combinations thereof. Method 500 may be performed by a local deskew correction circuit, in an embodiment. As shown in FIG. 5, method 500 begins by determining whether a duty cycle is within minimum or maximum thresholds or not (as determined at diamonds 510, 540 and 590). Depending upon the determination made, one of multiple flows occur. For ease of discussion, assume that a duty cycle greater than the minimum duty cycle threshold is detected.

As such, control passes to diamond 515 to determine whether the sampled data is of given values (e.g., "11" or "00") and the first data bit is a given value (e.g., "1" or "0"). If so, a correction code is applied to counter a negative skew between the two clocks (block 520). More specifically, such correction code may be applied via a local deskew adjuster. Next it is determined whether the sampled data is of given values (e.g., "01" or "10") (diamond 525). If so, it is determined whether a count meets a predetermined threshold, namely a count of iterations in which correct data was found (diamond 530). If not, control passes back to block 520 after incrementing a count of correct iterations (block 532), discussed above. If the count is reached, the correction code is correct and local calibration is completed (block 598).

Understand that the various other flows (beginning at diamonds 545, 565, and 592) may proceed as set forth in FIG. 5 for other situations depending on the value of the sampled data, such that correction codes can be applied as appropriate (blocks 550, 570 and 594 depending on whether a positive or negative skew is present). Thereafter it is determined whether data of a given value is sampled (diamonds 555, 575, and 595). If so, and if a count of correct iterations meets the predetermined threshold (as determined at diamond 560, 580 and 596), the given local calibration is completed. Understand while shown at this high level in the embodiment of FIG. 5, many variations and alternatives are possible.

Referring now to FIG. 6, shown is a graphical illustration of data sampling cases in accordance with an embodiment. More specifically, FIG. 6 illustrates sampling of a predetermined data sequence by multiple data samplers of a given data channel. As illustrated, there are four different operational cases, depending on whether a first sampler (which samples the data sequence according to a first clock signal (CK)) samples the first data as logic high or as logic low. Starting with a first scenario 610 in which the first sampler samples the incoming data sequence beginning with a logic high, a first case is that the two different samplers of the data channel sample the data at appropriately spaced apart phases (e.g., corresponding to a unit interval (UI)). As such, the two samplers sample the data at different values. As such, the intra-data channel pair of samplers samples the data correctly, and no local intra-pair deskew correction is needed. Instead, in cases two and three of scenario 610, the two data samplers sample data having the same value, indicating a skew in the clock signals. More specifically, case two illustrates a situation where there is negative skew, in that the two clock signals are separated by less than a unit interval. Instead, case three illustrates a situation of positive skew, where the two clocks are separated by more than a unit interval. In either case, a local deskew calibration process may be performed to provide an appropriate correction code (e.g., to a local delay adjuster) to enable the skew to reduce down to enable a correct reading of data separated by appropriately spaced phases of the two clock signals. Thus when this situation arises, such that the data sampled by the two samplers dithers as shown in case four, the calibration process may be completed, and the corresponding correction code is the correct correction code for the data channel, given current conditions.

Understand that scenario 620 further shown in FIG. 6 may proceed similarly. However, note that scenario 620 proceeds when the first sampled data by the first data sampler is at a logic low level. Nevertheless, the different cases illustrated here occur similarly as discussed above.

Embodiments may be implemented in a wide variety of communication circuits. Although the scope of the present invention is not limited in this regard, example embodiments can be incorporated into high speed parallel source synchronous interfaces such as interface circuits that operate at, e.g., 6.4 Gigabits per second (GBPS) or MIPI-CSI2, MIPI DPHY, or external chip-chip parallel interfaces. Still further, techniques described herein can perform deskewing globally and locally, to realize hardware/software margining.

Figure 7:
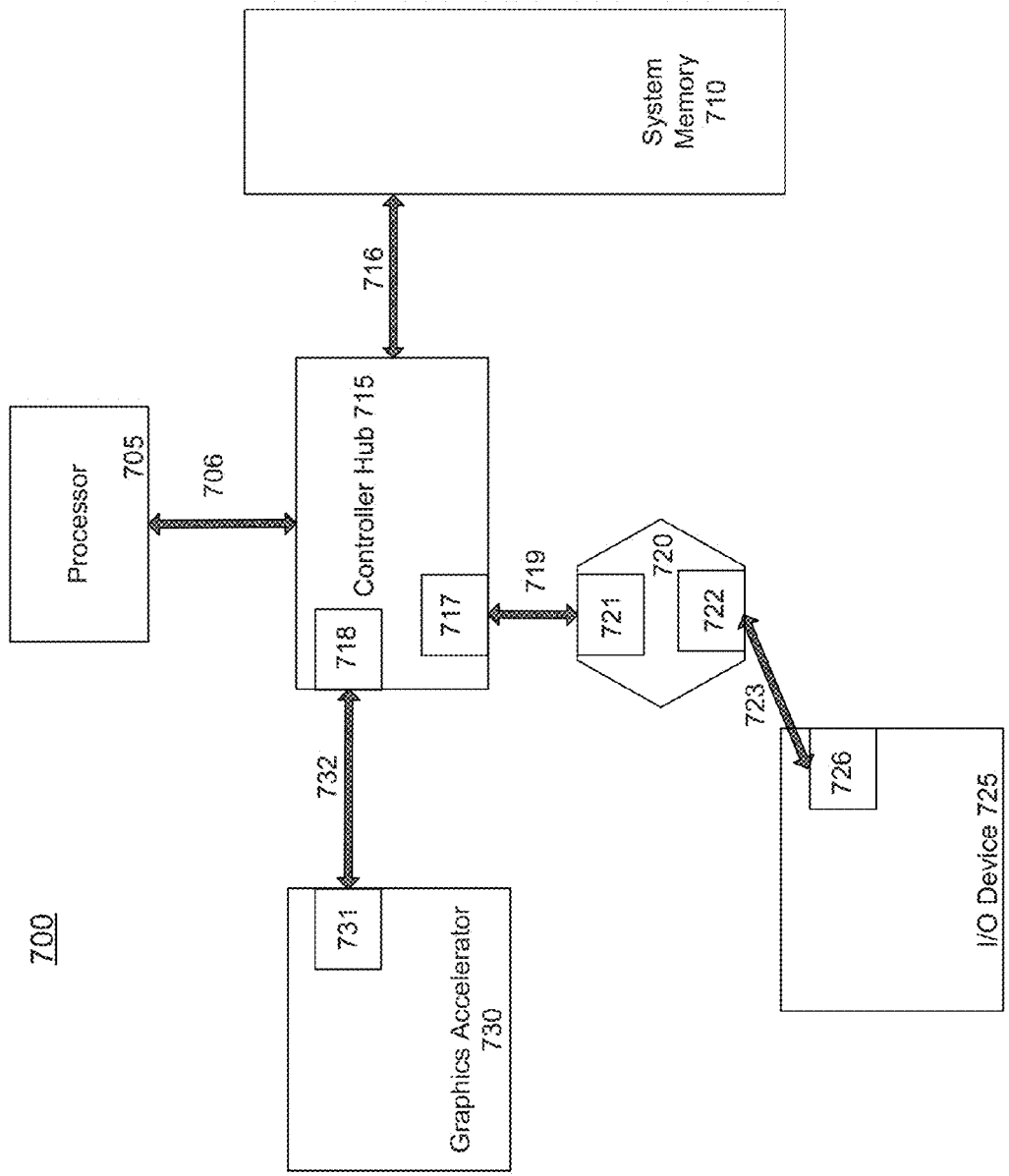
FIG. 7 is an embodiment of a fabric composed of point-to-point links that interconnect a set of components.

Referring to FIG. 7, an embodiment of a fabric composed of point-to-point links that interconnect a set of components is illustrated. System 700 includes processor 705 and system memory 710 coupled to controller hub 715. Processor 705 includes any processing element, such as a microprocessor, a host processor, an embedded processor, a co-processor, or other processor. Processor 705 is coupled to controller hub 715 through front-side bus (FSB) 706. In one embodiment, FSB 706 is a serial point-to-point interconnect. In another embodiment, link 706 includes a parallel serial, differential interconnect architecture that is compliant with different interconnect standards, and which may perform clock deskewing as described herein.

System memory 710 includes any memory device, such as random access memory (RAM), non-volatile (NV) memory, or other memory accessible by devices in system 700. System memory 710 is coupled to controller hub 715 through memory interface 716. Examples of a memory interface include a double-data rate (DDR) memory interface, a dual-channel DDR memory interface, and a dynamic RAM (DRAM) memory interface (any of which may optionally perform clock deskewing described herein).

In one embodiment, controller hub 715 is a root hub, root complex, or root controller in a PCIe interconnection hierarchy. Examples of controller hub 715 include a chip set, a memory controller hub (MCH), a northbridge, an interconnect controller hub (ICH), a southbridge, and a root controller/hub. Often the term chip set refers to two physically separate controller hubs, i.e. a memory controller hub (MCH) coupled to an interconnect controller hub (ICH). Note that current systems often include the MCH integrated with processor 705, while controller 715 is to communicate with I/O devices, in a similar manner as described below. In some embodiments, peer-to-peer routing is optionally supported through root complex 715.

Here, controller hub 715 is coupled to switch/bridge 720 through serial link 719. Input/output modules 717 and 721, which may also be referred to as interfaces/ports 717 and 721, include/implement a layered protocol stack to provide communication between controller hub 715 and switch 720. In one embodiment, multiple devices are capable of being coupled to switch 720.

Switch/bridge 720 routes packets/messages from device 725 upstream, i.e., up a hierarchy towards a root complex, to controller hub 715 and downstream, i.e., down a hierarchy away from a root controller, from processor 705 or system memory 710 to device 725. Switch 720, in one embodiment, is referred to as a logical assembly of multiple virtual PCI-to-PCI bridge devices. Device 725 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such a device is referred to as an endpoint. Although not specifically shown, device 725 may include a PCIe to PCI/PCI-X bridge to support legacy or other version PCI devices. Endpoint devices in PCIe are often classified as legacy, PCIe, or root complex integrated endpoints.

Graphics accelerator 730 is also coupled to controller hub 715 through serial link 732. In one embodiment, graphics accelerator 730 is coupled to an MCH, which is coupled to an ICH. Switch 720, and accordingly I/O device 725, is then coupled to the ICH. I/O modules 731 and 718 are also to implement a layered protocol stack to communicate between graphics accelerator 730 and controller hub 715. A graphics controller or the graphics accelerator 730 itself may be integrated in processor 705.

Figure 8:
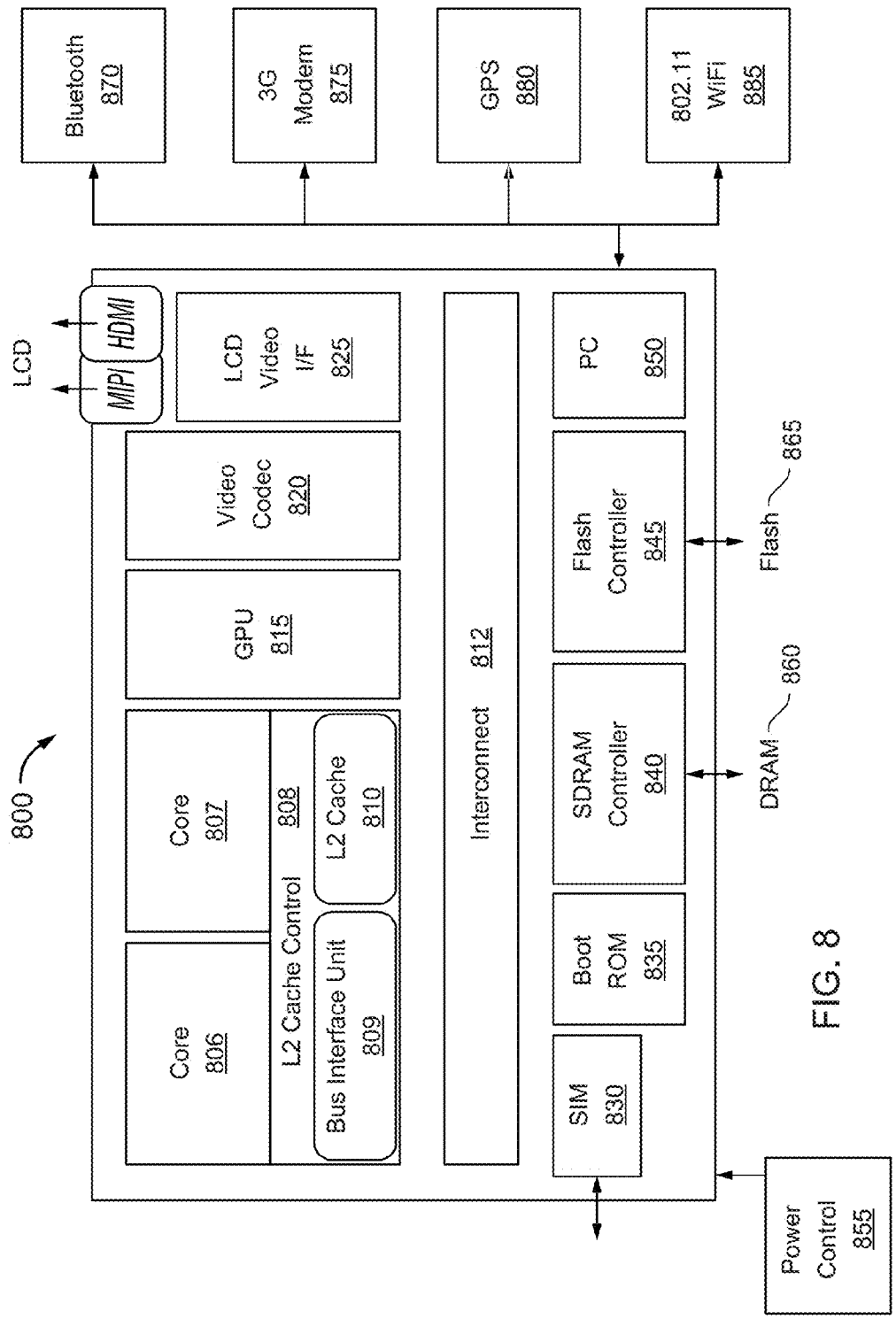
FIG. 8 is an embodiment of a system-on-chip design in accordance with an embodiment.

Turning next to FIG. 8, an embodiment of a SoC design in accordance with an embodiment is depicted. As a specific illustrative example, SoC 800 may be configured for insertion in any type of computing device, ranging from portable device to server system. Here, SoC 800 includes 2 cores—806 and 807. Cores 806 and 807 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 806 and 807 are coupled to cache control 808 that is associated with bus interface unit 809 and L2 cache 810 to communicate with other parts of system 800 via an interconnect 812.

Interconnect 812 provides communication channels to the other components, such as a Subscriber Identity Module (SIM) 830 to interface with a SIM card, a boot ROM 835 to hold boot code for execution by cores 806 and 807 to initialize and boot SoC 800, a SDRAM controller 840 to interface with external memory (e.g., DRAM 860), a flash controller 845 to interface with non-volatile memory (e.g., flash 865), a peripheral controller 850 (e.g., an eSPI interface) to interface with peripherals, video codecs 820 and video interface 825 to display and receive input (e.g., touch enabled input), GPU 815 to perform graphics related computations, etc. Any of these interfaces may incorporate aspects described herein, including clock deskewing where a source synchronous arrangement exists between transmitter and receiver. In addition, the system illustrates peripherals for communication, such as a Bluetooth® module 870, 3G modem 875, GPS 880, and WiFi 885. Also included in the system is a power controller 855.

Referring now to FIG. 9, shown is a block diagram of a system in accordance with an embodiment of the present invention. As shown in FIG. 9, multiprocessor system 900 includes a first processor 970 and a second processor 980 coupled via a point-to-point interconnect 950. As shown in FIG. 9, each of processors 970 and 980 may be many core processors including representative first and second processor cores (i.e., processor cores 974*a* and 974*b* and processor cores 984*a* and 984*b*).

Still referring to FIG. 9, first processor 970 further includes a memory controller hub (MCH) 972 and point-to-point (P-P) interfaces 976 and 978. Similarly, second processor 980 includes a MCH 982 and P-P interfaces 986 and 988. As shown in FIG. 9, MCH's 972 and 982 couple the processors to respective memories, namely a memory 932 and a memory 934, which may be portions of system memory (e.g., DRAM) locally attached to the respective processors. First processor 970 and second processor 980 may be coupled to a chipset 990 via P-P interconnects 962 and 964, respectively. As shown in FIG. 9, chipset 990 includes P-P interfaces 994 and 998.

Furthermore, chipset 990 includes an interface 992 to couple chipset 990 with a high performance graphics engine 938, by a P-P interconnect 939. As shown in FIG. 9, various input/output (I/O) devices 914 may be coupled to first bus 916, along with a bus bridge 918 which couples first bus 916 to a second bus 920. Various devices may be coupled to second bus 920 including, for example, a keyboard/mouse 922, communication devices 926 and a data storage unit 928 such as a disk drive or other mass storage device which may include code 930, in one embodiment. Further, an audio I/O 924 may be coupled to second bus 920. Any of the devices shown in FIG. 9 may be configured to perform clock deskewing as described herein, when in a source synchronous arrangement.

The following Examples pertain to further embodiments.

In one example, an apparatus comprises: a clock channel to receive and distribute a clock signal to a plurality of data channels; and the plurality of data channels. In an example, one or more of the plurality of data channels includes: a first sampler to sample data; a second sampler to sample the data; and a deskew calibration circuit to receive first sampled data from the first sampler and second sampled data from the second sampler and generate a local calibration signal, for use in the corresponding data channel. The apparatus further includes a global deskew calibration circuit to receive the clock signal from the clock channel, receive the first sampled data and the second sampled data from the plurality of data channels, and generate a global calibration signal for provision to the plurality of data channels.

In an example, the plurality of data channels further comprises: a first delay adjuster to receive the global calibration signal and adjust a phase of the clock signal based thereon; and a second delay adjuster to receive the local calibration signal and adjust a phase of at least one of a first sampling clock signal and a second sampling clock signal based thereon.

In an example, the first sampler is to sample the data according to the first sampling clock signal and the second sampler is to sample the data according to the second sampling clock signal.

In an example, the deskew calibration circuit is to generate the local calibration signal based at least in part on a duty cycle between the first sampling clock signal and the second sampling clock signal.

In an example, the plurality of data channels further comprises: a first buffer to receive the phase adjusted clock signal from the first delay adjuster and provide the phase adjusted clock signal to the second delay adjuster; and a second buffer to receive the phase adjusted clock signal from the first delay adjuster and provide the phase adjusted clock signal to the second delay adjuster, out of phase from the phase adjusted clock signal provided by the first buffer.

In an example, the global deskew calibration circuit is to dynamically and automatically generate the global calibration signal during a periodic calibration routine.

In an example, the clock channel is to distribute the clock signal according to a calibration clock signal generated in the clock channel during the calibration routine.

In an example, the global deskew calibration circuit is to provide a predetermined data sequence to the plurality of channels during the calibration routine.

In an example, the global deskew calibration circuit is to generate and provide an independent global calibration signal to each of the plurality of data channels.

In an example, the deskew calibration circuit of each of the plurality of data channels is to execute independently, responsive to initiation by the global deskew calibration circuit.

In an example, the apparatus comprises a receiver to receive source synchronous multi-lane parallel data from a transmitter.

In another example, a method comprises: receiving a predetermined data sequence in a receiver; sampling, in a plurality of data channels of the receiver, the predetermined data sequence according to a first local clock and a second local clock; performing a first skew calibration process in a first data channel of the plurality of data channels if a first portion of the sampled predetermined data sequence in the first data channel is not a first value to generate a local correction code for the first data channel; and performing a second skew calibration process in the receiver to generate a correction code for the plurality of data channels.

In an example, generating the correction code for the plurality of data channels comprises generating a plurality of independent correction codes, each for one of the plurality of data channels.

In an example, the method further comprises sending one of the plurality of independent correction codes to each of the plurality of data channels.

In an example, the method further comprises causing the receiver to generate the predetermined data sequence, generate a calibration clock signal and provide the predetermined data sequence and the calibration clock signal to the plurality of data channels.

In an example, the method further comprises: determining whether at least the first portion of the sampled predetermined data sequence in the plurality of data channels is a common value; causing the receiver to regenerate the predetermined data sequence if the first portion of the sampled predetermined data sequence in the plurality of data channels is not the common value; and completing the second skew calibration process if the first portion of the sampled predetermined data sequence in the plurality of data channels is the common value.

In an example, the method further comprises storing the first portion of the sampled predetermined data sequence received from the plurality of data channels in a storage of the receiver.

In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In a still further example, a system comprises: a transmitter to send information including data and a clock signal via a plurality of parallel links; and a receiver coupled to the transmitter to receive the information. The receiver may comprise: a clock channel to receive and distribute the clock signal to a plurality of data channels; and the plurality of data channels. One or more of the plurality of data channels includes: a first sampler to sample at least some of the data; and a second sampler to sample the at least some of the data. The receiver may further include a first circuit to receive the clock signal from the clock channel, receive the first sampled test data and the second sampled test data from the plurality of data channels, and generate a global calibration signal for provision to the plurality of data channels.

In an example, the system comprises a multi-chip module including a first semiconductor die having the transmitter and a second semiconductor die having the receiver.

In an example, at least some of the plurality of data channels further comprises: a second circuit to receive first sampled test data from the first sampler and second sampled test data from the second sampler and generate a local calibration signal; a first delay adjuster to receive the global calibration signal and adjust a phase of the clock signal based thereon; a first buffer to receive the phase adjusted clock signal from the first delay adjuster; a second buffer to receive the phase adjusted clock signal from the first delay adjuster; and a second delay adjuster coupled to the first buffer and the second buffer, the second delay adjuster to receive an output of the first buffer and the second buffer, the local calibration signal and adjust a phase of at least one of a first sampling clock signal to clock the first sampler and a second sampling clock signal to clock the second sampler.

Understand that various combinations of the above examples are possible

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a clock channel to receive and distribute a clock signal to a plurality of data channels;
the plurality of data channels, wherein each of the plurality of data channels includes:
a first sampler to sample data;
a second sampler to sample the data; and
a deskew calibration circuit to receive first sampled data from the first sampler and second sampled data from the second sampler and generate a local calibration signal for use in the corresponding data channel;
a global deskew calibration circuit to receive the clock signal from the clock channel, receive the first sampled data and the second sampled data from the plurality of data channels, and generate a global calibration signal for provision to the plurality of data channels, wherein the plurality of data channels further comprises:
a first delay adjuster to receive the global calibration signal and adjust a phase of the clock signal based thereon;
a second delay adjuster to receive the local calibration signal and adjust a phase of at least one of a first sampling clock signal and a second sampling clock signal based thereon, wherein the first sampler is to sample the data according to the first sampling clock signal and the second sampler is to sample the data according to the second sampling clock signal;
a first buffer to receive the phase adjusted clock signal from the first delay adjuster and provide the phase adjusted clock signal to the second delay adjuster; and
a second buffer to receive the phase adjusted clock signal from the first delay adjuster and provide the phase adjusted clock signal to the second delay adjuster, out of phase from the phase adjusted clock signal provided by the first buffer.

2. The apparatus of claim 1, wherein the deskew calibration circuit is to generate the local calibration signal based at least in part on a duty cycle between the first sampling clock signal and the second sampling clock signal.

3. The apparatus of claim 1, wherein the global deskew calibration circuit is to dynamically and automatically generate the global calibration signal during a periodic calibration routine.

4. The apparatus of claim 3, wherein the clock channel is to distribute the clock signal according to a calibration clock signal generated in the clock channel during the calibration routine.

5. The apparatus of claim 4, wherein the global deskew calibration circuit is to provide a predetermined data sequence to the plurality of channels during the calibration routine.

6. The apparatus of claim 1, wherein the global deskew calibration circuit is to generate and provide an independent global calibration signal to each of the plurality of data channels.

7. The apparatus of claim 1, wherein the deskew calibration circuit of each of the plurality of data channels is to execute independently, responsive to initiation by the global deskew calibration circuit.

8. The apparatus of claim 1, wherein the apparatus comprises a receiver to receive source synchronous multi-lane parallel data from a transmitter.

9. A system comprising:
a transmitter to send information including data and a clock signal via a plurality of parallel links; and
a receiver coupled to the transmitter to receive the information, the receiver comprising:
a clock channel to receive and distribute the clock signal to a plurality of data channels;

the plurality of data channels, wherein each of the plurality of data channels includes:
  a first sampler to sample at least some of the data; and
  a second sampler to sample the at least some of the data;
a first circuit to receive the clock signal from the clock channel, receive the data sampled by the first sampler and the data sampled by the second sampler from the plurality of data channels, and generate a global calibration signal for provision to the plurality of data channels, wherein at least some of the plurality of data channels further comprises:
  a second circuit to receive first sampled test data from the first sampler and second sampled test data from the second sampler and generate a local calibration signal;
  a first delay adjuster to receive the global calibration signal and adjust a phase of the clock signal based thereon;
  a first buffer to receive the phase adjusted clock signal from the first delay adjuster;
  a second buffer to receive the phase adjusted clock signal from the first delay adjuster; and
  a second delay adjuster coupled to the first buffer and the second buffer, the second delay adjuster to receive an output of the first buffer and the second buffer, and the local calibration signal and adjust a phase of at least one of a first sampling clock signal to clock the first sampler and a second sampling clock signal to clock the second sampler.

10. The system of claim 9, wherein the system comprises a multi-chip module including a first semiconductor die having the transmitter and a second semiconductor die having the receiver.

* * * * *